United States Patent [19]
Hochi et al.

[11] Patent Number: 6,049,170
[45] Date of Patent: Apr. 11, 2000

[54] HIGH FREQUENCY DISCHARGE ENERGY SUPPLY MEANS AND HIGH FREQUENCY ELECTRODELESS DISCHARGE LAMP DEVICE

[75] Inventors: Akira Hochi, Nara; Mamoru Takeda, Kyoto; Kazuyuki Sakiyama, Shijonawate, all of Japan

[73] Assignee: Matsushita Electric Industrial Co., Ltd., Osaka, Japan

[21] Appl. No.: 08/961,300

[22] Filed: Oct. 30, 1997

[30] Foreign Application Priority Data

Nov. 1, 1996 [JP] Japan ...................... 8-291420

[51] Int. Cl.⁷ .................................. H01J 65/04
[52] U.S. Cl. .................. 315/39; 315/248; 315/39.53
[58] Field of Search ................... 315/39, 39.53, 315/248, 267, 344

[56] References Cited

U.S. PATENT DOCUMENTS

| | | | |
|---|---|---|---|
| 2,414,085 | 1/1947 | Hartman | 315/39.53 X |
| 2,972,084 | 2/1961 | Esterson et al. | 315/39.53 |
| 3,577,207 | 5/1971 | Kirjushin | 315/39 |
| 5,180,946 | 1/1993 | Aiga et al. | 315/39.53 X |
| 5,210,465 | 5/1993 | Squibb | 315/39.53 |
| 5,446,426 | 8/1995 | Wu et al. | 333/125 |
| 5,525,865 | 6/1996 | Simpson | 315/248 X |

FOREIGN PATENT DOCUMENTS

| 59-86153 | 5/1984 | Japan . |
|---|---|---|
| 8-222187 | 8/1996 | Japan . |

OTHER PUBLICATIONS

G.B. Collins, "Microwave Megnetrons", *McGraw–Hill Book Company, Inc.*, pp. 48–69 (1948).

*Primary Examiner*—Benny T. Lee
*Attorney, Agent, or Firm*—Ratner & Prestia

[57] ABSTRACT

Use of a side resonator group comprising a plurality of side resonators, each including both an electromagnetically inductive function section made of a substantially ringed conductive material and an electrically capacitive function section made of a gap, so arranged in a circle as to make said electrically capacitive function sections opposed to the center as high frequency energy supply means, enables a high frequency discharge to take place in a smaller space than that observed in use of a conventional cavity resonator. Besides, application of said high frequency energy supply means to a high frequency electrodeless lamp device enables high frequency energy to be effectively coupled even with a relatively small size of electrodeless discharge lamp.

25 Claims, 13 Drawing Sheets

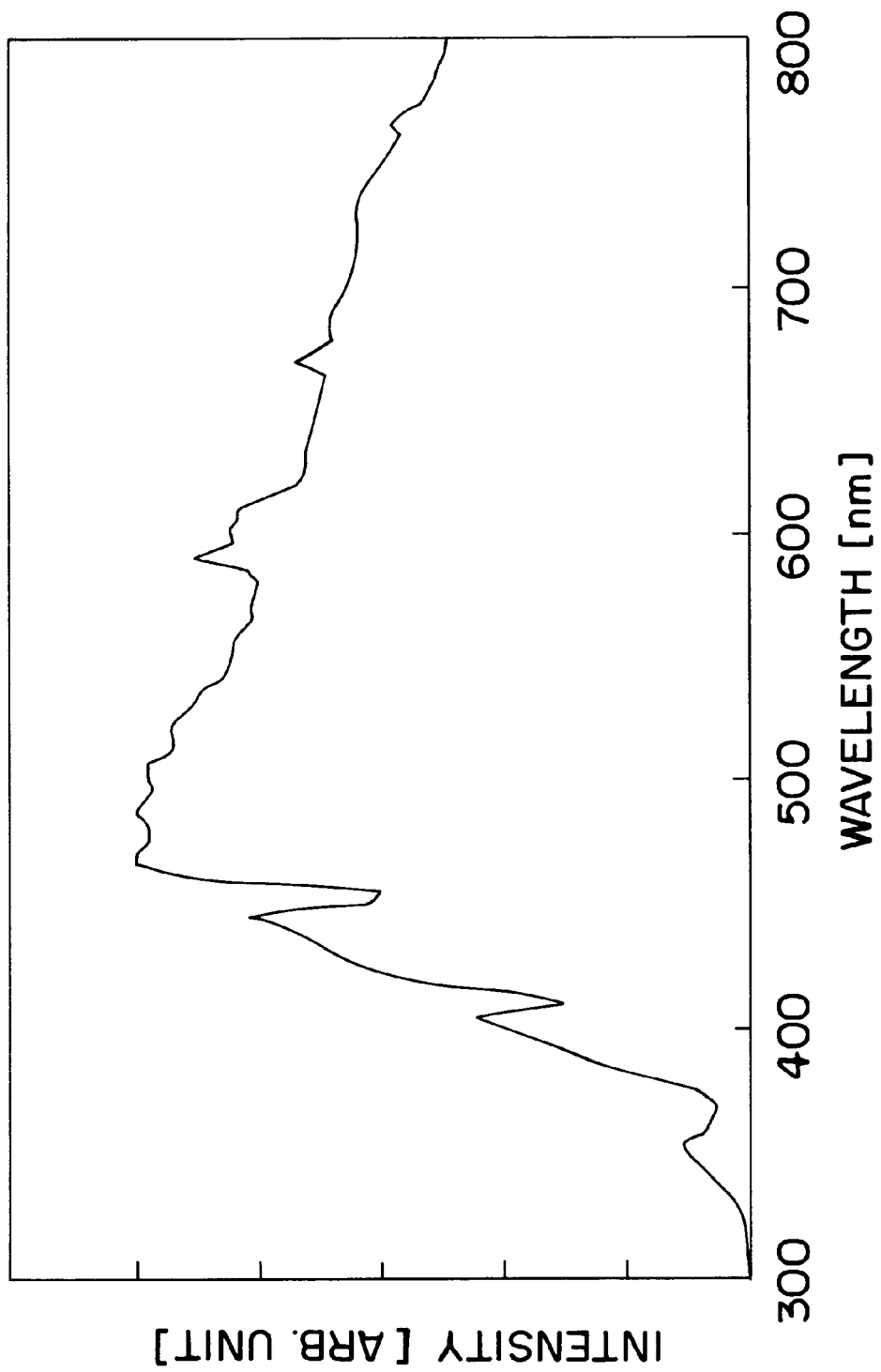
F I G. 9

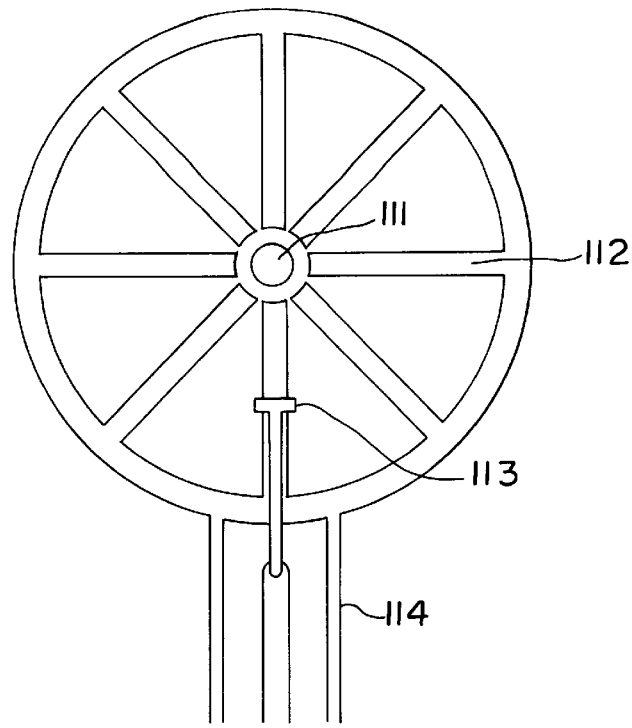
F I G. 11
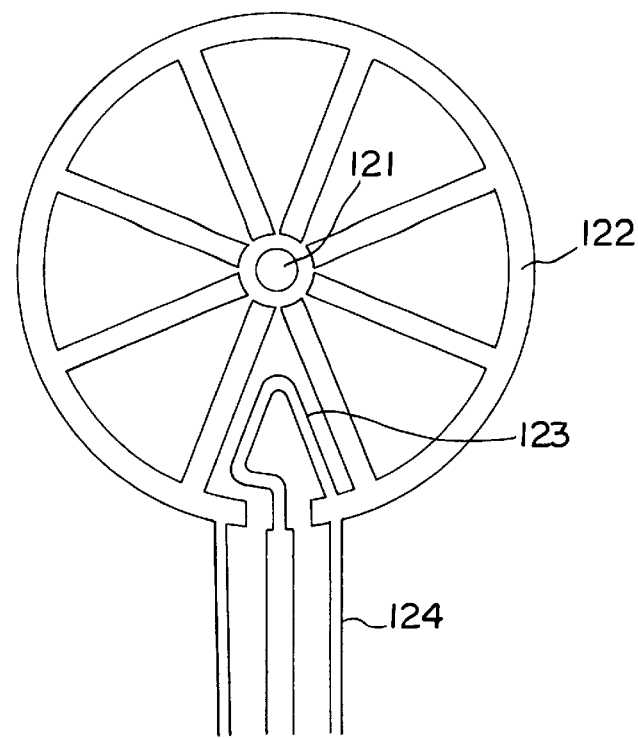
F I G. 12

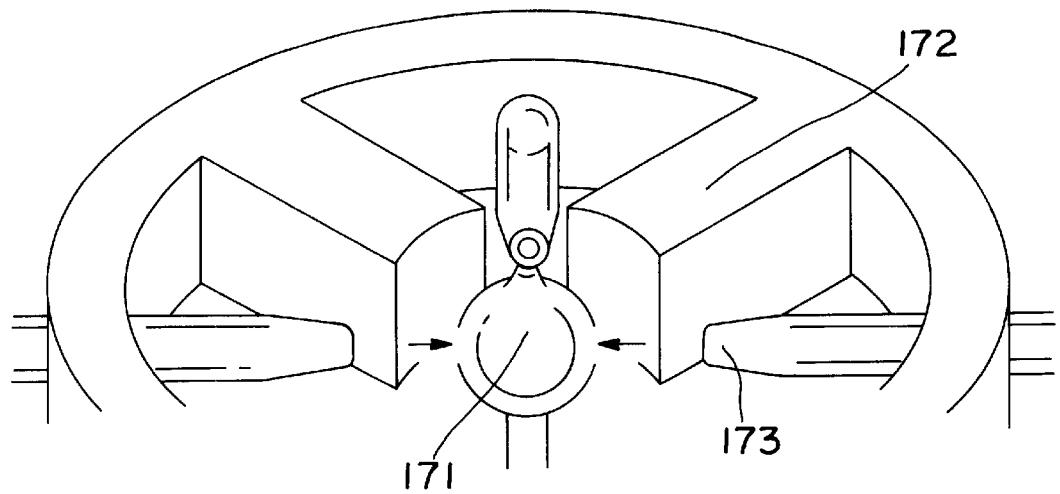
F I G. 17
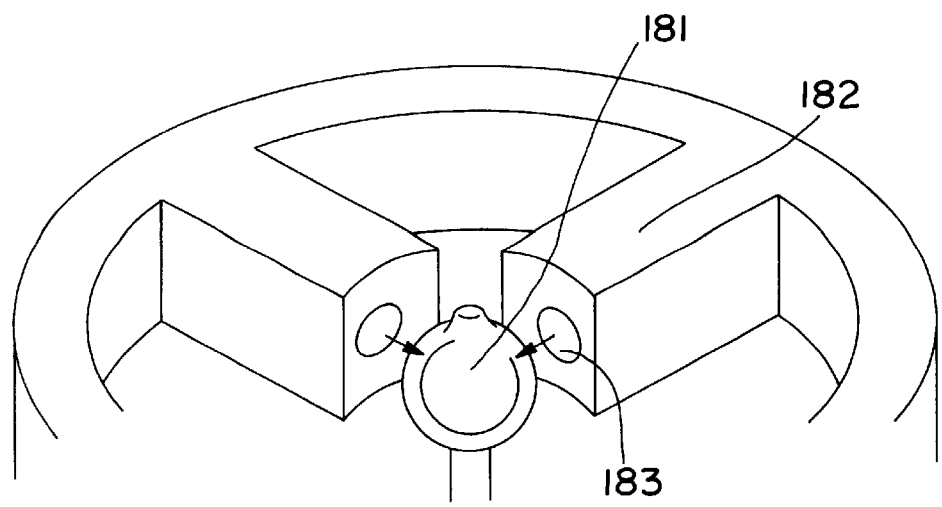
F I G. 18

HIGH FREQUENCY DISCHARGE ENERGY SUPPLY MEANS AND HIGH FREQUENCY ELECTRODELESS DISCHARGE LAMP DEVICE

BACKGROUND OF THE INVENTION

1. Field of the Invention

The present invention relates to means for supplying the high frequency energy and a high frequency electrodeless discharge lamp device using the same.

2. Related Art of the Invention

In view of the characteristics such as high efficiency and high color rendering, application of a high-intensity discharge lamp, in particular metal halide lamp, to a light source for the liquid crystal video-projector or the like has been advanced in recent years as a high output point light source substitutable for a halogen lamp. Besides, in view of characteristics such as high color rendering, development of its application also to a sports lighting corresponding to the high-definition TV broadcasting or the display lighting such as museum/gallery has been advanced.

Above all, a high frequency electrodeless discharge lamp has a merit, compared to electroded arc discharge lamp in that electromagnetic energy is easily connected to a filler, mercury can be saved from a filler for the discharge light emission and making the light emission highly efficient is desirable. Besides, because of there being no electrode inside a discharge space, no blackening of a bulb inner wall by the evaporation of electrodes takes place. Thus, the life of a lamp can be prolonged to a great extent. From these features, research and development of such electrodeless lamps has been extensively carried out as high-intensity discharge lamps of the next generation.

Hereinafter, a conventional high frequency electrodeless discharge lamp will be described referring to "Microwave Electrodeless Lamp" disclosed in Japanese Patent Laid-Open No. 59-86153.

That is, a conventional microwave electrodeless lamp is so arranged that the electrodeless lamp is provided in a microwave cavity resonator having an opening with the appendant mesh impenetrable to microwave and a microwave oscillator is linked therewith. Here, the maximal size of a discharge bulb in this electrodeless discharge lamp is smaller than the wavelength of a microwave used.

In such an arrangement, the microwave energy generated by a microwave oscillator is coupled to the discharge bulb through a slit on the wall of the above-mentioned microwave cavity resonator provided for the transmission of a microwave to excite an enclosed medium in the discharge bulb. In this manner, a radiant light generated from a microwave electrodeless discharge lamp is so arranged as to be taken out to the exterior of the microwave cavity resonator through a mesh provided at the above-mentioned microwave cavity resonator.

Like this, a cavity resonator has so far been generally used as high frequency energy supply means of an electrodeless discharge lamp device using a high frequency wave, especially microwave.

Incidentally, since generally in a discharge lamp device, the design of luminous intensity distribution can be more idealized with a smaller-sized light source, downsizing of a plasma arc as light source is widely required in the application field of illumination.

On the other hand, in electrodeless discharge lamps, the size of a plasma arc is determined by the inside diameter of the bulb. Accordingly, for the downsizing of a plasma arc, to make the inside diameter of the bulb smaller is needed.

With an arrangement which supplies energy to the bulb of an electrodeless discharge lamp by means of the cavity resonator of the above-mentioned conventional electrodeless discharge lamp, however, the coupling rate of microwave energy worsens and reflective waves increase if the size of a bulb is far smaller than that of the cavity resonator, thereby causing bad effects such as the worsening of the light emission efficiency and a drastic decrease in the starting function of lamp lighting. Consequently, the size of a bulb could not be reduced below the limit size determined by that of the cavity resonator.

Besides, with the above-mentioned arrangement of the above conventional electrodeless discharge lamp, a cavity resonator has been used as means for the supply of energy to an electrodeless discharge lamp. The size of a cavity resonator is determined by the wavelength of a high frequency wave applied. Besides, for the distinction from the band for a general information communication, the band of high frequency waves (ISM(Industrial, Scientific, Medical) band) available for industrial use is previously determined. For that reason, the size of a cavity resonator could not be reduced below the size determined by the wavelength limits of high frequency band available.

From these, there has been a problem that the size of a bulb cannot be reduced below that determined by the wavelength limits of high frequency band available.

For example, for a high frequency wave of 2.45 GHz (wavelength: 122 mm), commonly used ISM band, the size of a plasma arc capable of retaining a stable discharge is experimentally limited at and above about 15 mm.

On the other hand, in consideration of application to liquid crystal video projector, the size of a plasma arc below about 3 mm is determined from the convenience of optical design for a rise in the utilizing efficiency of emissions.

Accordingly, the high frequency electrodeless discharge lamp device using a cavity resonator had a problem of inappropriateness in applications where a point light source with a high luminosity is required. Thus, a high frequency energy supply means is intensively desired which can supply a high frequency electromagnetic resonance field concentratively into a smaller space than the cavity resonator.

SUMMARY OF THE INVENTION

In consideration of the above-mentioned conventional problems hitherto, one purpose of the present invention is to provide high frequency energy supply means capable of concentratively supplying a high frequency electromagnetic resonance field to an even smaller space than the existing and a high frequency electrodeless discharge lamp device using the same.

High frequency energy supply means is formed by a side resonator group comprising a plurality of side resonators disposed in a substantially ringed shape, and the side resonator includes: an electromagnetically inductive function section made of a conductive material for generating an induction current with a change in a magnetic field, and the electromagnetically inductive function section being substantially ringed shape; and an electrically capacitive function section has a gap provided in at least a part of a route of said induction current, wherein the electrically capacitive function section is situated on the center side of the ringed shape surrounded by the side resonators and by a high frequency electromagnetic resonance field generated at a center of the ringed shape when energy is given from an exterior of the side resonator group, high frequency energy is supplied to an object disposed at the center of the ringed shape.

High frequency energy supply means is formed by a vane type side resonator comprising a cylinder made of a conductive material and a plurality of vanes made of a conductive material, wherein by a high frequency electromagnetic resonance field generated in an interior of the vane type side resonator when energy is given from an exterior of the vane type side resonator, high frequency energy is supplied to an object disposed in the interior.

High frequency energy supply means is formed by a hole-slot type side resonator made of a conductive material having a plurality of holes and slots, wherein by a high frequency electromagnetic resonance field generated in an interior of the hole-slot type side resonator when energy is given from an exterior of the hole-slot type side resonator, high frequency energy is supplied to an object disposed in the interior.

A high frequency electrodeless discharge lamp device comprises: high frequency energy supply means as set forth in any one of the first to the ninth inventions; an electrodeless discharge lamp disposed at the center of the high frequency energy supply means; high frequency wave leakage preventing means enclosing the high frequency energy supply means, at least part of which is optically transparent; high frequency resonance field excitation means for exciting a high frequency electromagnetic resonance field in the plurality of side resonators constituent of said high frequency energy supply means; high frequency oscillation means for oscillating a high frequency wave; and high frequency propagation means for propagating the high frequency waves oscillated from the high frequency oscillation means to the high frequency resonance field excitation means.; wherein by the high frequency electromagnetic resonance field generated at the center of a ringed shape surrounded by the plurality of side resonators, high frequency energy necessary for the discharge of the electrodeless discharge lamp is supplied.

A high frequency electrodeless discharge lamp device comprises: high frequency energy supply means as set forth in any one of the first to ninth inventions;

an electrodeless discharge lamp disposed at the center of the high frequency energy supply means; light reflection means for reflecting the light emitted from said electrodeless discharge lamp; high frequency wave. leakage preventing means enclosing the high frequency energy supply means, at least part of which is optically transparent; high frequency resonance field excitation means for exciting a high frequency electromagnetic resonance field in the plurality of side resonators constituent of the high frequency energy supply means; high frequency oscillation means for oscillating a high frequency wave; and high frequency propagation means for propagating the high frequency waves oscillated from the high frequency oscillation means to the high frequency resonance field excitation means; wherein the light reflection means comprises (1) first light reflection means for reflecting said light passing the high frequency wave leakage preventing means to the exterior and provided outside the high frequency wave leakage preventing means; and (2) second light reflection means made of a nonconductive material and provided inside the high frequency wave leakage preventing means for reflecting said light from the interior to the exterior of the high frequency wave leakage preventing means, and by the high frequency electromagnetic resonance field generated at a center of a ringed shape surrounded by the plurality of side resonators, high frequency energy necessary for the discharge of the electrodeless discharge lamp is supplied.

A high frequency electrodeless discharge lamp device comprises: high frequency energy supply means as set forth in any one of the first to ninth inventions; an electrodeless discharge lamp disposed at the center of the high frequency energy supply means; light reflection means for reflecting the light emitted from the electrodeless discharge lamp; high frequency wave leakage preventing means enclosing the high frequency energy supply means, at least part of which is optically transparent; high frequency resonance field excitation means for exciting a high frequency electromagnetic resonance field in the plurality of side resonators constituent of the high frequency energy supply means; high frequency oscillation means for oscillating a high frequency wave; and high frequency propagation means for propagating the high frequency waves oscillated from the high frequency oscillation means to the high frequency resonance field excitation means; wherein a part of the inner wall surface of the high frequency wave leakage preventing means is a light reflection surface, the part of the inner wall surface is light reflection means for reflecting the light from the interior to the exterior of the high frequency wave leakage preventing means and by the high frequency electromagnetic resonance field generated at a center of a ringed shape surrounded by the plurality of side resonators, high frequency energy necessary for the discharge of the electrodeless discharge lamp is supplied.

A high frequency electrodeless discharge lamp device comprises: high frequency energy supply means as set forth in any one of the first to the ninth inventions; an electrodeless discharge lamp disposed at the center of the high frequency energy supply means; light reflection means for reflecting the light emitted from the electrodeless discharge lamp; high frequency wave leakage preventing means enclosing the high frequency energy supply means, at least part of which is optically transparent; high frequency resonance field excitation means for exciting a high frequency electromagnetic resonance field in the plurality of side resonators constituent of the high frequency energy supply means; high frequency oscillation means for oscillating a high frequency wave; and high frequency propagation means for propagating the high frequency waves oscillated from the high frequency oscillation means to the high frequency resonance field excitation means; wherein the light reflection means is provided outside the high frequency wave leakage preventing means and serves to reflect the light passing through the high frequency wave leakage preventing means to the exterior, and by the high frequency electromagnetic resonance field generated at a center of a ringed shape surrounded by the plurality of side resonators, high frequency energy necessary for the discharge of the electrodeless discharge lamp is supplied.

A high frequency electrodeless discharge lamp device comprises: high frequency energy supply means as set forth in any one of the first to the ninth inventions; an electrodeless discharge lamp disposed at the center of the high frequency energy supply means; light reflection means for reflecting the light emitted from the electrodeless discharge lamp; high frequency wave leakage preventing means enclosing the high frequency energy supply means, at least part of which is optically transparent; high frequency resonance field excitation means for exciting a high frequency electromagnetic resonance field in the plurality of side resonators constituent of the high frequency energy supply means; high frequency oscillation means for oscillating a high frequency wave; and high frequency propagation means for propagating the high frequency waves oscillated from the high frequency oscillation means to the high frequency resonance field excitation means; wherein the light reflection means is provided inside the high frequency wave leakage preventing means and serves to reflect the light passing through the high frequency wave leakage preventing means to the exterior and made of a nonconductive material, and by the high frequency electromagnetic resonance field generated at the ringed center surrounded by the plurality of side resonators, high frequency energy necessary for the discharge of the electrodeless discharge lamp is supplied.

According to the present invention, for example, it becomes possible even by using a high frequency wave of 2.45 GHz to keep lighting a relatively small plasma arc of not greater than 10 mm stably.

Incidentally, the "high frequency wave" in this specification signifies an electromagnetic wave having a frequency between 1 MHz and 100 GHz. Especially in "microwave frequencies of a frequency range of 300 MHz to 30 GHz, the present invention can obtain a preferred effect.

BRIEF DESCRIPTION OF THE DRAWINGS

FIG. 9 is a radiant spectrum graph of an electrodeless lamp by means of a 8-vane type side resonator group according to Embodiment 1 of the present invention;

FIG. 11 is an illustration of high frequency resonance field excitation means of an electric field coupling type side resonator group according to Embodiment 2 of the present invention;

FIG. 12 is an illustration of high frequency resonance field excitation means of a magnetic field coupling type side resonator group according to Embodiment 2 of the present invention;

FIG. 17 is an illustration of bulb cooling means using a dielectric nozzle according to Embodiment 7 of the present invention; and FIG. 18 is an illustration of bulb cooling means using a nozzle perforated in the inside protuberant portion of a side resonator group according to Embodiment 7 of the present invention.

DESCRIPTION OF THE REFERENCE NUMERALS

Figure 1A:
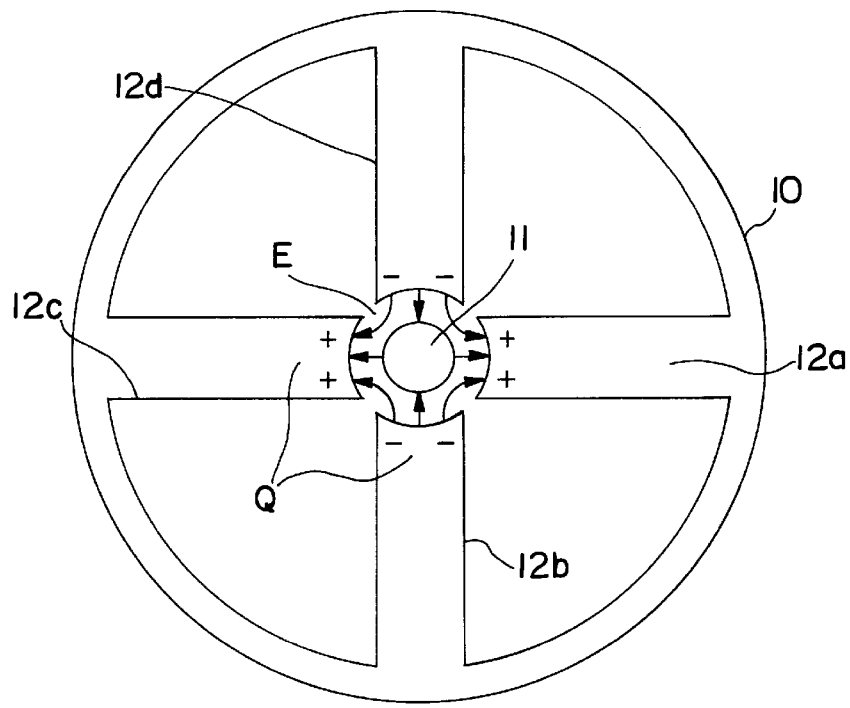
FIGS. 1A, 1B and 1C are illustrations of high frequency electromagnetic resonance fields in a 4-vane type side resonator group according to Embodiment 1 of the present invention.

10: vane type side resonator group
12a, 12b, 12c and 12d: vane
32: hole-slot type side resonator group
11, 21, 31, 41, 51, 101, 111, 121, 131, 141, 151, 161, 171, 181: electrodeless discharge lamp
12, 22, 32, 42, 52, 102, 112, 122, 132, 142, 152, 162, 172, 182: side resonator group
173, 183: bulb cooling means nozzle

DESCRIPTION OF THE PREFERRED EMBODIMENTS

Hereinafter, embodiments of the present invention will be described referring to the drawings. (Embodiment 1)

Here, Embodiment 1 of high frequency energy supply means according to the present invention will be described.

Figure 1B:
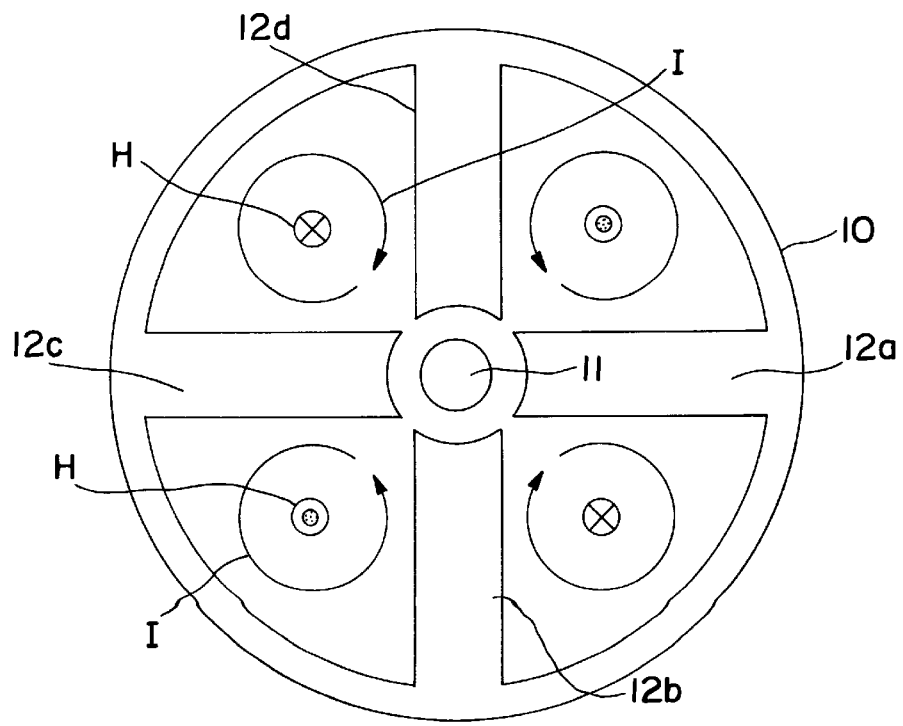
Figure 1C:
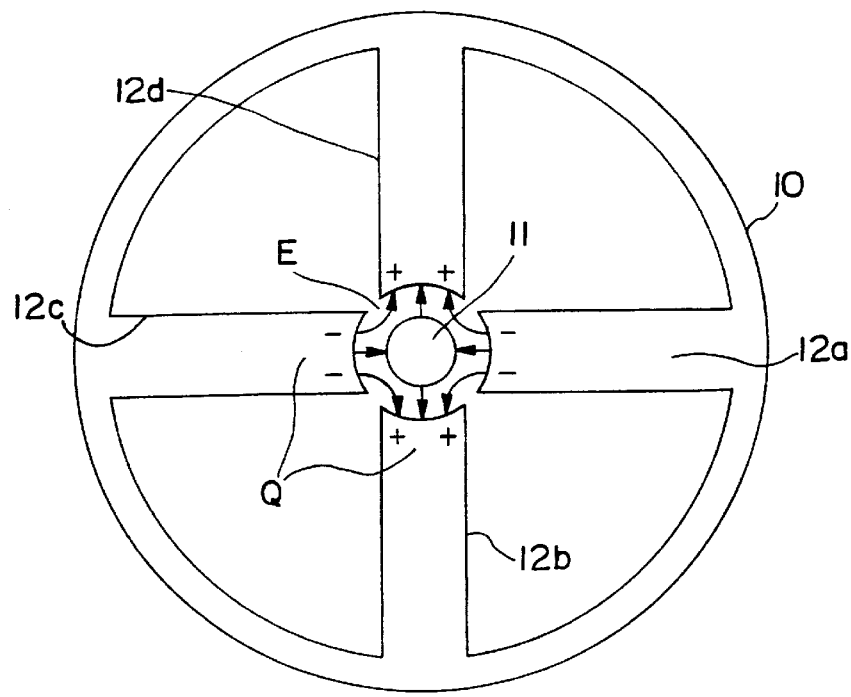

First, referring to FIGS. 1A and 1C, the arrangement of this embodiment is mentioned and at the same time it will be qualitatively described in what shape the side resonator group forms a resonant electromagnetic field.

As shown in FIG. 1A, the vane type side resonator group 10, made of a conductive material low in conductivity such as copper, forms a structure in which 4 vanes 12a–12d protrude toward the center from a cylinder. And, at its center, an electrodeless discharge lamp 11 is provided.

The arrows shown in FIGS. 1A and 1C are electric lines of force in a high frequency electric resonance field E, where "+" and "−" denote the positive and negative polarities of a charge Q generated at the protuberant portion of a vane, respectively. Under action of the high frequency electric resonance field E mentioned above, an ionizable medium in the electrodeless discharge lamp 11 induces discharges and emits light. Besides, the circles shown in FIG. 1B denote the direction of a high frequency magnetic resonance field crossing the nearly ringed conductor portion comprising vanes and a cylinder. The symbol designated with ● in ○ denotes a high frequency magnetic resonance field generated in the direction of the near side about the paper, whereas the symbol designated with x in ○ denotes a high frequency magnetic resonance field generated in the direction of the far side about the paper. The arrow around a symbol of magnetic field denotes the direction of eddy current I flowing on the surface of a nearly ringed electromagnetically inductive function section comprising vanes and a cylinder.

If individual adjacent vane type side resonator is so designed as to operate in the π mode with a n phase shifting from each other, adjacent protuberant portions are alternately electrified with a charge Q in opposite plus and minus polarity as shown in FIG. 1A. At that time, a gap between the protuberant portions of individual vanes serves as electrically capacitive function portion like a capacitor to generate an electric field E. Next, as shown in FIG. 1B, a surface current I is generated so as to cancel the electrified charge, which is accompanied. with the occurrence of a high frequency magnetic resonance field H. At that time, a nearly ringed electromagnetically inductive function section comprising vanes and a cylinder serves as electrically capacitive function section like an inductor. By this surface current I, a distribution of charge Q having the opposite polarity to that of FIG. 1A and a high frequency electric resonance field E having the opposite phase (opposite direction) are generated as shown in FIG. 1C. While electric fields and magnetic fields are alternately generated by repeating such a process, the vane type side resonator 10 continues a resonance.

Figure 2:
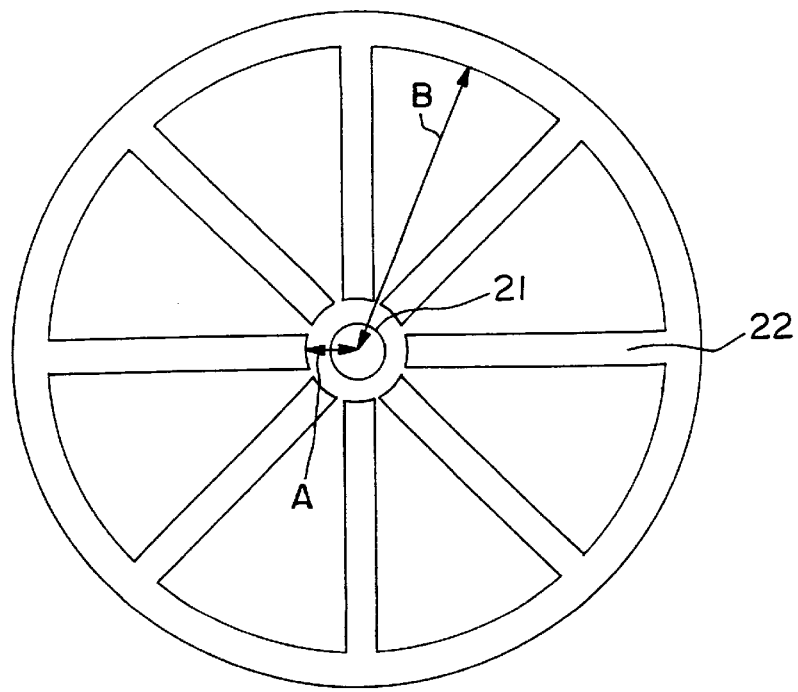
FIG. 2 is an illustration of a high frequency electromagnetic resonance field in an 8-vane type side resonator group according to Embodiment 1 of the present invention.

Side resonator groups for obtaining such high frequency electromagnetic resonance fields are not limited in shape to the 4-vane type side resonator group 10 shown in FIG. 1A. For example, even if the number of vanes is increased as with an 8-vane type side resonator group 22 shown in FIG. 2, high frequency electromagnetic resonance fields can be obtained similarly.

FIGS. 1a, 1b and 1c each show vane type side resonator group 10 including vanes 12a, 12b, 12c and 12d. Electrodeless discharge lamp 11 is shown in the center of vane type ride resonator group 10.

Figure 3:
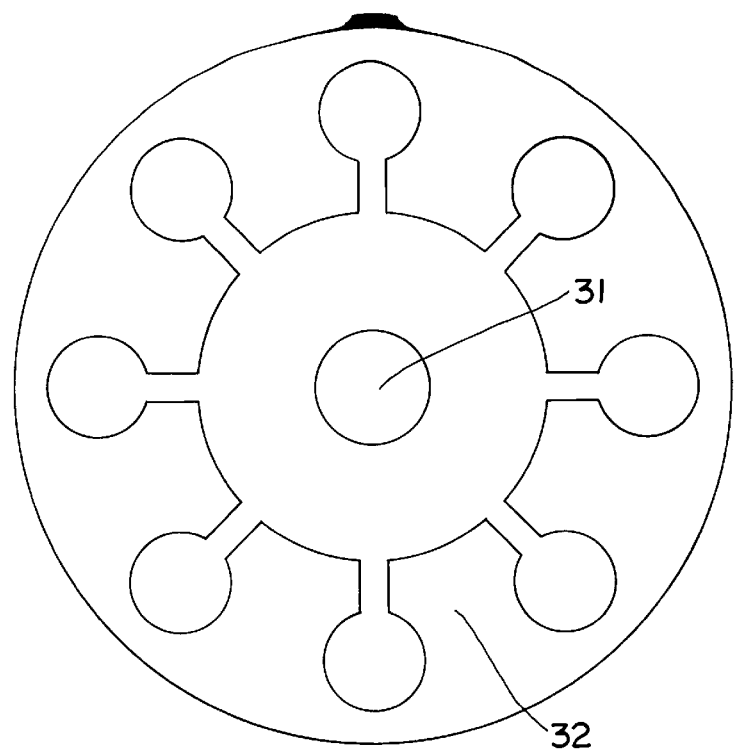
FIG. 3 is an illustration of a high frequency electromagnetic resonance field in an 8-hole-slot type side resonator group according to Embodiment 1 of the present invention.

Besides, use of a hole-slot type side resonator group 32 with a plurality of cylindrical holes provided in a conductor and slots forming gaps provided in part of holes as shown in FIG. 3 is also allowable. By using either of these side resonator groups 22 and 32, a high frequency energy can be supplied to an electrodeless discharge lamp 21 (see FIG. 2) or 31 (see FIG. 3) as with the 4-vane type side resonator group exemplified above.

Incidentally, the shape of vane type side resonator groups 10 and 22 (cf. FIGS. 1A and 2) according to this embodiment is similar to that of a vane type side resonator used in a conventional magnetron. And, the shape of hole-slot type side resonator group 32 (cf. FIG. 3) according to this embodiment is also similar to that of a hole-slot type side resonator used in a conventional magnetron. Here, the principal difference between these conventional resonators and the high frequency energy supply means of the present invention will be described.

That is, a conventional resonator as mentioned above is employed as an anode of a magnetron, whereas a cathode of the magnetron is disposed at the center of the conventional resonator.

As evident from such a conventional arrangement, in that, whereas the high frequency energy supply means of the present application is provided for the supply of high frequency energy to the bulb at the center, the above resonator used in a conventional magnetron is provided for the determination of the oscillation frequency of a microwave energy outputted from the center electrode to the exterior, the role/operation of both is quite, different.

In other words, the inventors of the present invention invented high frequency energy supply means for supplying energy to an object disposed at the center by using a high frequency wave input from outside, no idea of which had occurred on any one from the role of a resonator used in a conventional magnetron.

Meanwhile, as a mode of high frequency electromagnetic field generated in the side resonator group mentioned above, description in FIG. 1 was performed in accordance with the π mode in which phases of the adjacent side resonators shift by π from each other, but the mode of a side resonator group is not limited to this.

Figure 4:
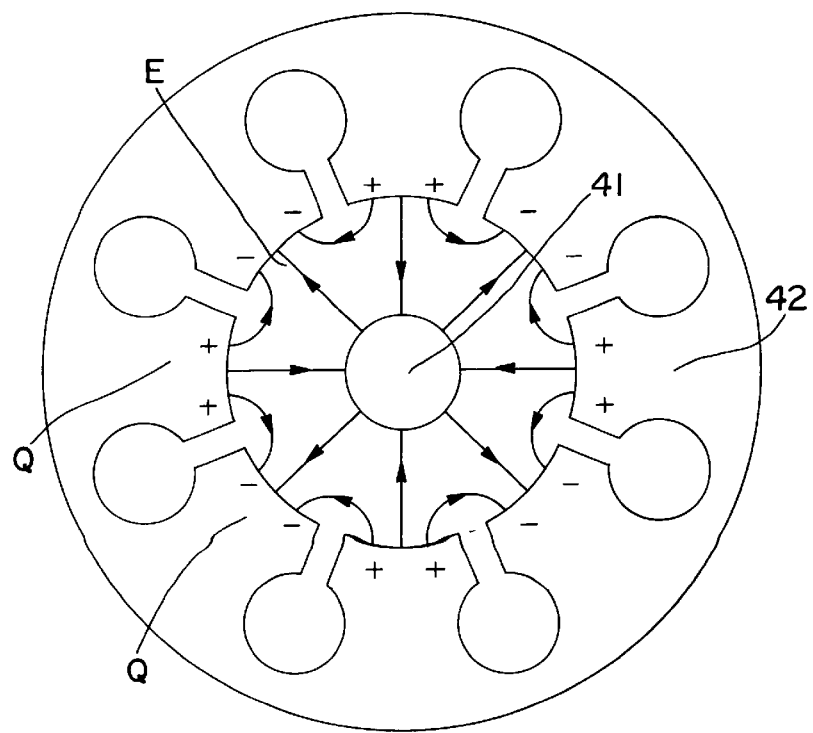
FIG. 4 is an illustration of a high frequency electromagnetic resonance field in an 8-hole-slot type side resonator group of π-mode operation according to Embodiment 1 of the present invention.

For example, when an 8-hole-slot type side resonator group 42 is driven in the π mode as shown in FIG. 4, the polarity is opposite for every other charge Q. Under action of the high frequency electric resonant field E generated by this charge Q, the electrons in a plasma generated inside the electrodeless discharge lamp 41 end in being attracted cross-wise. Since the cross-wise distribution of plasma generated in this mode shifts by 45° for X periods, the electrodeless discharge lamp 41 can obtain a relatively uniform temperature distribution on the bulb surface.

If desired to positively operate a side resonator group in the π mode as mentioned above, a more desirable method is to electrically couple every other vanes (or protuberant portions) by means of a strap ring comprising a conductor in such a manner that every other vanes (or protuberant portions) are equal in the polarity of a charge Q.

Figure 5:
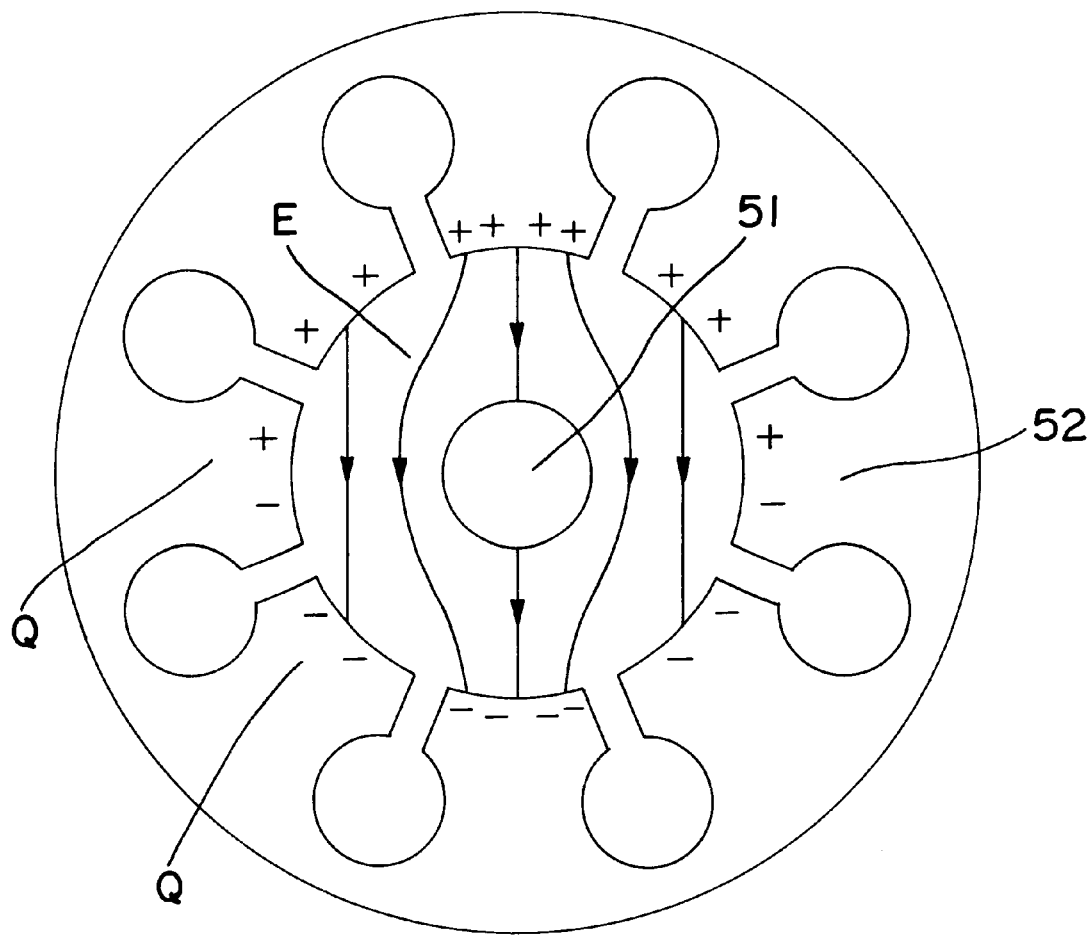
FIG. 5 is an illustration of a high frequency electromagnetic resonance field in an 8-hole-slot type side resonator group of π/4-mode operation according to Embodiment 1 of the present invention.

On the other hand, when an 8-hole-slot type side resonator 52 is driven in the π/4 mode in which phases of the adjacent side resonators shift by π/4 from each other as shown in FIG. 5, a charge Q is opposite in polarity at the opposed protuberant portion.

The high frequency electric resonance field E generated by this charge Q orientates in a radial direction of the center of the side resonator group 52 and has a distribution of crossing the electrodeless discharge lamp 51.

Needless to say, the number of side resonators from which a mode causing a high frequency electric resonance field with a distribution of crossing the electrodeless discharge lamp 51 to take place as shown in FIG. 5 can be obtained is not limited to 8. With the number of side resonators made equal to N, a high frequency electric resonance field similar that shown in FIG. 5 can be obtained when the phase difference between the adjacent side resonators is 2 π/N.

Incidentally, in the case shown in FIG. 5, a mode can be implemented in which a stronger electric field is obtained at the center than that of the arrangement of FIG. 4.

Figure 6:
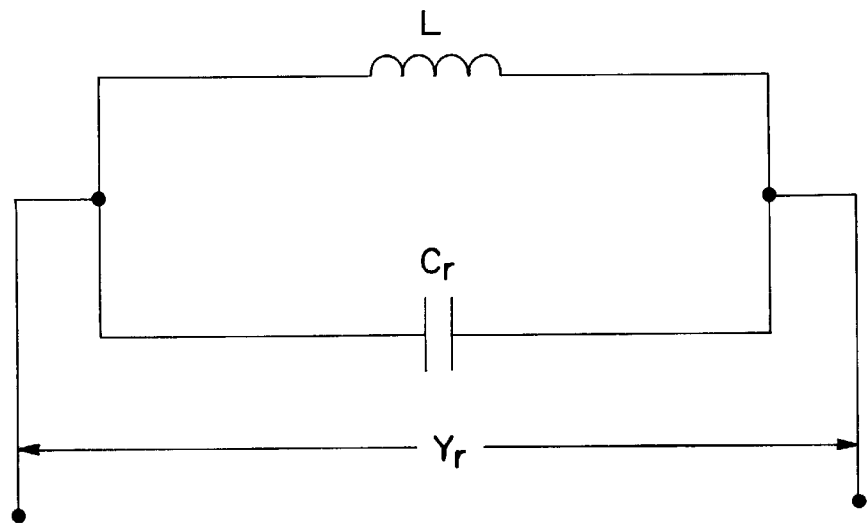
FIG. 6 is an equivalent circuit of a side resonator according to Embodiment 1 of the present invention.

If one of the side resonators is expressed in terms of an equivalent circuit, it is represented by an LC resonator composed of an inductance L and a capacitance $C_r$ connected in parallel as shown in FIG. 6. At that time, the electric resistance of the conductor, regarded as smaller enough than L and $C_r$, is neglected. As mentioned earlier, the nearly ringed electromagnetically inductive function section comprising vanes and a cylinder creates an inductance L originating from a magnetic field H and a surface current I and the electrically capacitive function section comprising a gap between individual protuberant portions serves as a capacitance $C_r$. The admittance $Y_r$ of this equivalent circuit is expressed in Equation 1.

[Equation 1]

$$Y_r = j\left(\omega C_r - \frac{1}{\omega L}\right) \text{ where } w \text{ is radions/second.}$$

Figure 7:
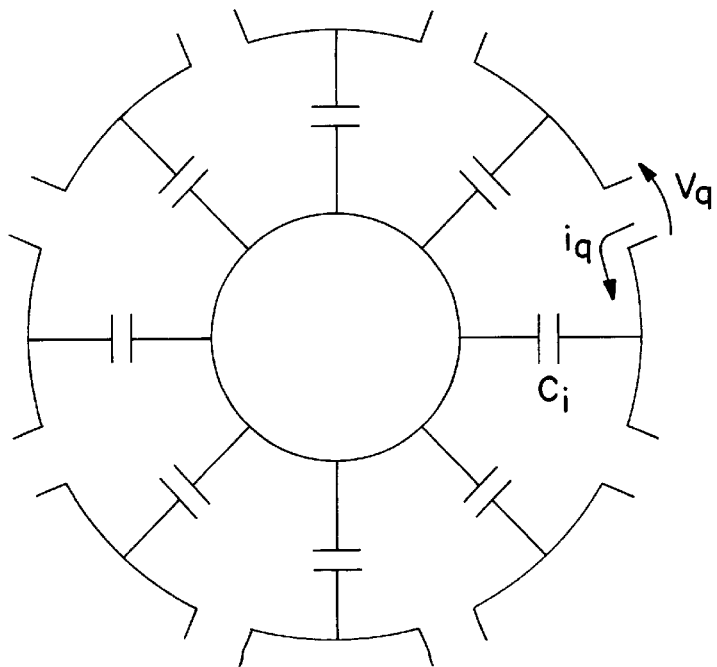
FIG. 7 is an equivalent circuit of a side resonator group according to Embodiment 1 of the present invention.

Next, FIG. 7 shows the equivalent circuit of a coupling of one side resonator with the other (N−1) side resonators and the plasma. Individual side resonators are connected to the respective free ends represented by a voltage $V_q$ and a current $I_q$. How ever, the electric resistance of the plasma is also neglected f or simplicity. Letting $C_i$ be the coupling capacity of individual interaction spaces, the admittance of an interaction space viewed from one side resonator becomes as expressed in Equation 2.

[Equation 2]

$$Y_n = \frac{j\omega C_i}{2\left(1 - \cos\frac{2\pi n}{N}\right)}$$

As shown in Equation 3, the resonance of a side resonator when the admittance of one side resonator is equal to that of the interaction space viewed from one side resonator.
[Equation 3]

$$Y_n = -Y_r$$

It follows from the admittance expressed in Equation 1 that the angular resonance frequency $\omega_0$ of one side resonator is expressed in the following Equation 4.
[Equation 4]

$$\omega_0 = \frac{1}{\sqrt{LC_r}}$$

At this time, the angular resonance frequency $\omega$ of the side resonator group is expressed from Equation 3 as follows:
[Equation 5]

$$\omega = \omega_0 \sqrt{\frac{1}{1 + \dfrac{C_i}{C_r}{2\left(1 - \cos\dfrac{2\pi n}{N}\right)}}}$$

As mentioned above, however, N is the number of side resonators and n is called mode number and assumes values of 1 to N/2 in a resonance mode forming the fundamental. For example, an 8-hole-slot type side resonator group as already shown in FIGS. 4 and 5 operates in the π/4 mode for n=1 and in the s mode for n=N/2=4. The admittance (and resonance frequency) in the actual shapes of a side resonator and an interaction space can be evaluated by the analytic technique in accordance with the solution of the differential equation derived from the Maxwell's equations satisfying the boundary condition that the tangential component of the electric field on the surface of the conductive material section forming the side resonance group is 0 and the initial condition that the electric field E in the gap of each side resonator is uniform.

For the design means for obtaining a desired resonance frequency according to this embodiment, books or the like explaining a magnetron are helpful.

Thus, with respect to the design means of a side resonator group by a more detailed analytic technique, it is advisable to consult "Microwave Magnetron; McGRAW-HILL (1948)" by G. B. Collins or the like.

Besides, to obtain a desired resonance frequency, not only an analytic technique to evaluate the admittance of an equivalent circuit by the analysis of the differential equations derived from Maxwell's equations, but a recently significantly developed design based on the finite element method using computer is also effective.

Figure 8:
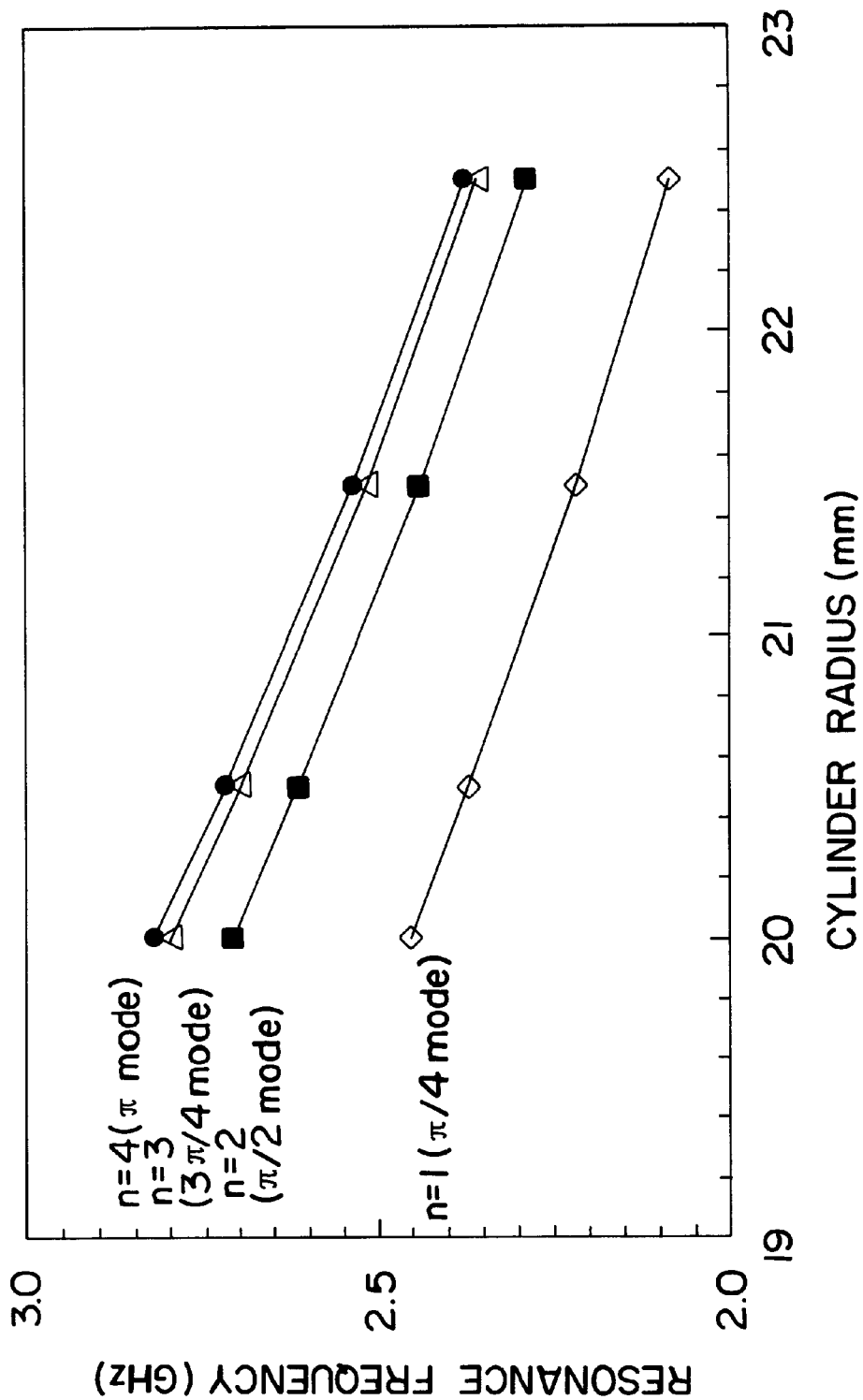
FIG. 8 is a calculation analysis graph of resonance frequencies in a 8-vane type side resonator group according to Embodiment 1 of the present invention.

Here, FIG. 8 shows an example of analysis to evaluate the resonance frequency of a vane type side resonator group by using the finite element method. In this case, under conditions that the number of vanes is 8, the plate thickness of a vane is 2.5 mm, the inner radius of the cylindrical space formed by the protuberant portions of vanes (in FIG. 2, corresponding to the size of the portion with Symbol A) is fixed to 5 mm and the inner radius of a cylinder portion (in FIG. 2, corresponding to the size of the portion with Symbol B) varies within the range of 20 mm to 22.5 mm, the resonance frequency is evaluated by the analysis of eigenvalues in the 2-dimension.

With increasing frequency in the same radius of a cylinder, a resonance is found to take place in sequence from the π/4 mode, mode of smallest number (n=1) to the π mode, mode of the largest number (n=4). Besides, the larger the radius of the cylinder portion, the lower the resonance frequency in the same mode becomes. For example, at 2.45 GHz, ISM band, a resonance of the π/4 mode and the π mode is found to take place for a radius of about 20 mm and about 22 mm in the cylinder portion, respectively.

At this time, the inner diameter of the cylinder space formed by the vane protuberant portions in which an electrodeless discharge lamp is provided is 10 mm. With the cavity resonator used for a general high frequency electrodeless discharge, a diameter of more than about 76 mm is necessary for obtaining a high frequency electromagnetic resonance field of 2.45 GHz even in the cylinder $TE_{11n}$ mode allowing a high frequency electromagnetic resonance field to be formed at the smallest diameter. Comparison with this reveals that a high frequency electric resonance field generated at the center of this vane type side resonator group 22 can be concentrated into a very small space.

FIG. 9 shows the spectral distribution observed when a side resonator group of the π/4 mode with an inner radius of 20 mm in the cylinder portion, belonging to one of the conditions shown in FIG. 8, is prepared by using copper and an electrodeless discharge lamp is lighted. This spectral distribution was observed when an electrodeless discharge lamp with 0.4 mg of InBr and 1.33 kPa of Ar gas enclosed in an electrodeless discharge tube made of a spherical quartz glass having an inner diameter of about 3 mm was lighted at a microwave input of 150 W. The lamp efficacy represented by the total luminous flux per microwave input to the side resonator group was about 50 l m/W. Incidentally, the general color rendering index (CRI) and color temperature for this spectroscopic distribution were 96 and about 5800 K, respectively.

As mentioned above, energy supply means according to the present invention enables a high frequency electric resonance field to be concentrated into a smaller space than a cavity resonator used in general. Thus, it becomes possible to efficiently couple high frequency energy with a smaller-sized electrodeless discharge lamp than conventional.

EMBODIMENT 2

Hereinafter, the embodiment of the high frequency electrodeless discharge lamp device using high frequency energy supply means mentioned in Embodiment 1 will be described referring to FIG. 10.

Figure 10:
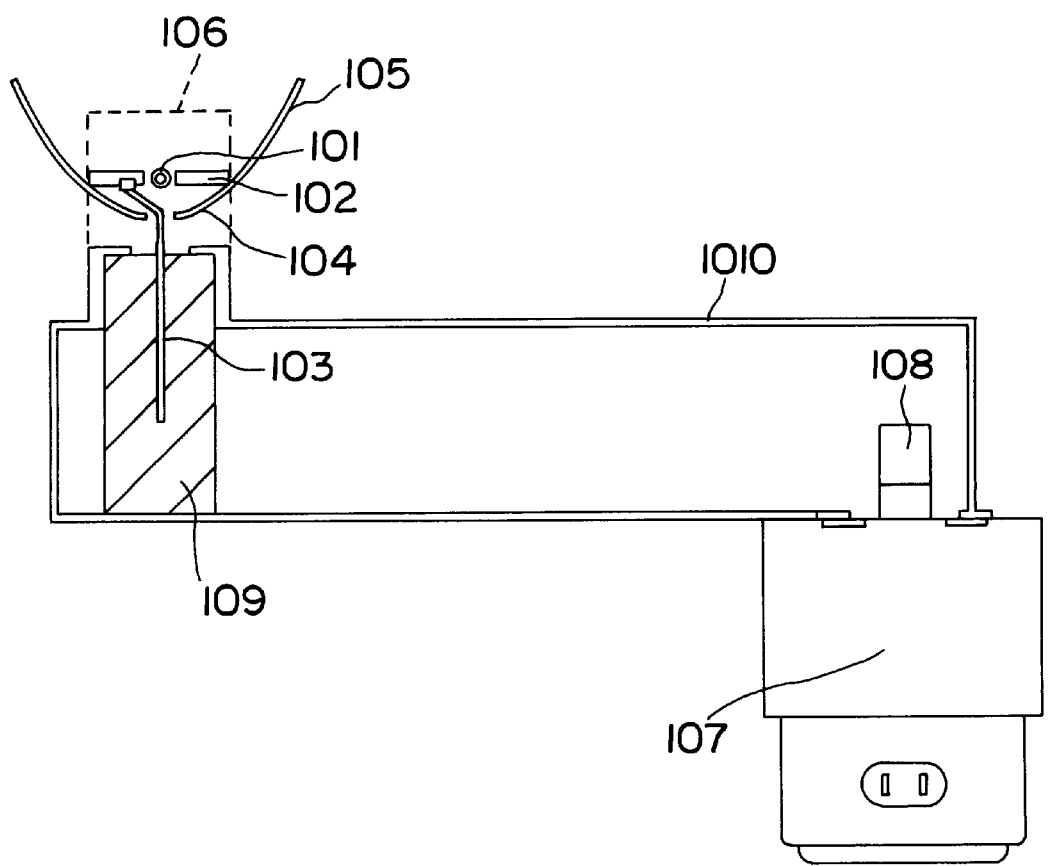
FIG. 10 is a schematic sectional view of a high frequency electrodeless discharge lamp device according to Embodiment 2 of the present invention.

In FIG. 10, Numeral 101 denotes an electrodeless discharge lamp made of a quartz glass globe in which an ionizable medium is enclosed for discharge-irradiating by high frequency waves. The electrodeless discharge lamp 101 is supported by a support bar made of quartz glass similarly at the center of the side resonator group 102 described in Embodiment 1. Numeral 1010 denotes a high frequency waveguide made of metal conductor. Numeral 107 denotes a magnetron for driving a high frequency wave, an oscillating antenna 108 is provided inside the high frequency waveguide 1010. In such a manner that the resonance frequency of the side resonator group 102 coincides with the frequency of high frequency waves transmitted from the oscillating antenna 108, the size of individual parts of the side resonator group 102 is designed. By application of a high voltage to the magnetron 107 from a high voltage power source, high frequency waves are oscillated inside the high frequency waveguide 1010 and the propagated high frequency energy is coupled with the side resonator group 102 through the coupling antenna 103. High frequency leakage preventing means 106, formed with a mesh made of a metal material such as nickel plated with silver, is provided outside the side resonator group 102. Thereby, high frequency waves radiated from the open end of the side resonator group 102 do not leak outside.

By a high frequency electromagnetic resonance field generated at the center of the side resonator group 102, an ionizable medium inside the electrodeless discharge lamp 101 causes a discharge and emits light. Irradiation by discharge is reflected from a first reflection mirror 105 provided outside the high frequency leakage preventing means 106 and a second reflection mirror 104, made of a nonconductive material, provided inside the high frequency leakage preventing means 106 and reflected rays can be obtained in a desired direction. Reflected mirrors of parabolic surface or elliptic surface may be employed in accordance with the optical system used.

The length of the high frequency waveguide 1010, especially the distance from the oscillating antenna 108 to the coupling antenna 103 is so determined as to make the VSWR sufficiently small during the stable lighting time of the electrodeless discharge lamp 101. Furthermore, to improve the impedance matching, matching means such as stub or protrusion made of a metal conductor is provided inside the high frequency waveguide 1010 if necessary. Besides, Numeral 109 denotes a dielectric for fixing the coupling antenna 103 at a proper position.

Next, high frequency resonance field excitation means for exciting the side resonator group by coupling a high frequency energy therewith will be described referring to FIGS. 11 and 12. As shown in FIG. 10, a high frequency energy generated from high frequency oscillation means such as magnetron is coupled with the side resonator group through the coupling antenna. This coupling method includes that of electric field coupling type as shown in FIG. 11 and that of magnetic field coupling type as shown in FIG. 12.

To excite the side resonator 112 of FIG. 11 and make a resonance, the peripheral conductor portion 114 of a coaxial tube is joined to the outside of the side resonator cylinder by welding or the like and the central conductor portion 113 of the coaxial tube is joined to one vane protuberant portion by welding or caulking. By high frequency energy propagated through the coaxial tube, a charge is generated on the vane connected to the central cylindrical conductor 113. The resultant high frequency electric field propagates to individual side resonators and a high frequency electromagnetic resonance field takes place in the side resonator group. The electrodeless discharge lamp 111 is excited by the high frequency electric resonance field generated at the center of the side resonator group 112 and makes a discharge to emit light.

Similarly, in FIG. 12 to excite the side resonator 122 and make a resonance, the peripheral conductor portion 124 of a coaxial tube is joined to the outside of the side resonator cylinder by welding and the central conductor portion 123 of the coaxial tube forms a loop antenna in one space between vanes and is joined to the interior of the cylinder by welding or the like. By high frequency energy propagated through the coaxial tube, a high frequency magnetic field is generated inside the loop antenna from a current flowing through the central cylindrical conductor 123. The resultant high frequency magnetic field propagates to individual side resonators and a high frequency electromagnetic resonance field takes place in the side resonator group. The electrodeless discharge lamp 121 is excited by the high frequency electric resonance field generated at the center of the side resonator group 122 and make a discharge to emit light.

As described above, the high frequency electrodeless discharge lamp device using energy supply means according to Embodiment 2 enables a high frequency energy resonance field to be effectively coupled with a smaller-sized electrodeless discharge lamp than the high frequency electrodeless discharge device using general cavity resonators and also enables the bulb temperature to be made uniform.

EMBODIMENT 3

In Embodiment 2, an example of using a waveguide as principal high frequency propagation means was shown.

Figure 13:
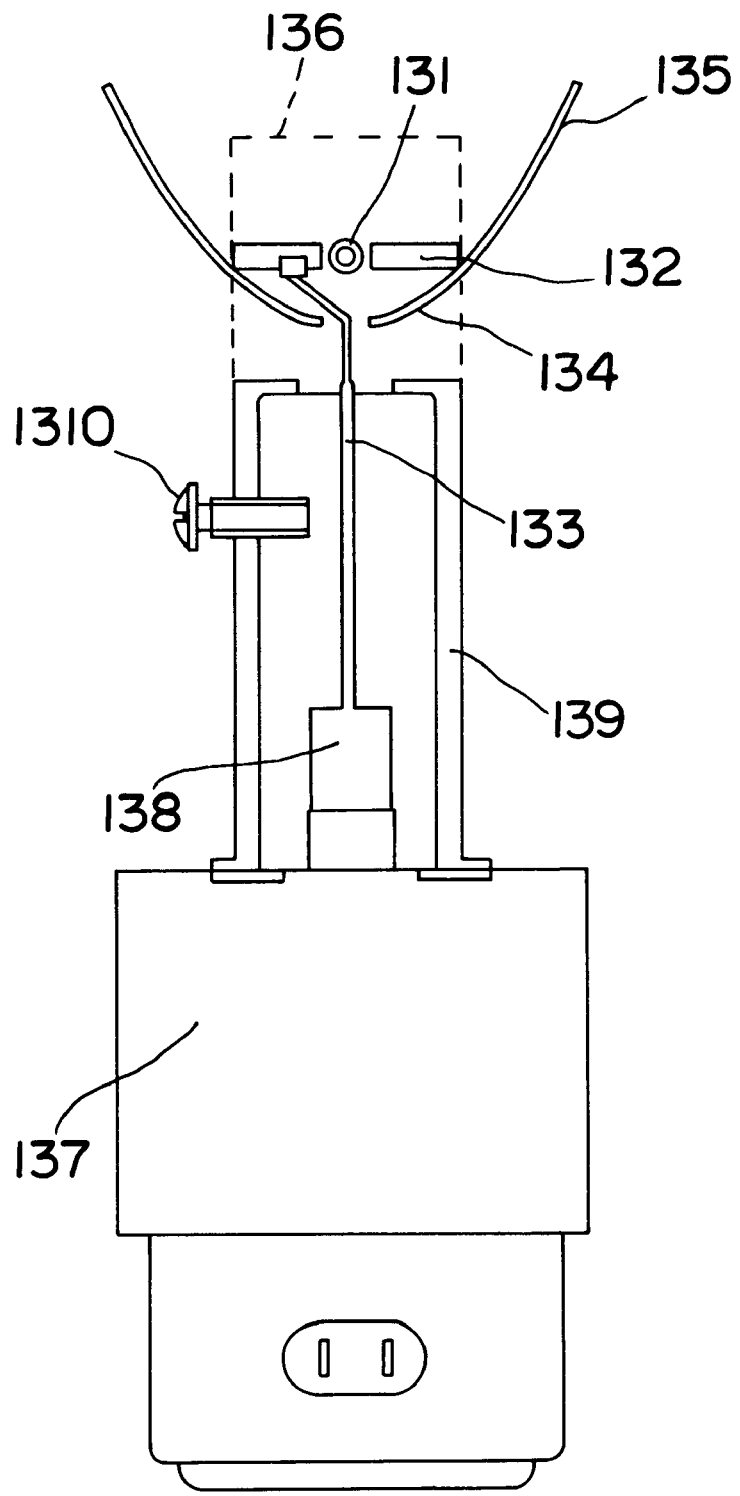
FIG. 13 is a schematic sectional view of a high frequency electrodeless discharge lamp device according to Embodiment 3 of the present invention.

Embodiment 3 for propagating a high frequency energy directly from high frequency oscillation means by using a coaxial tube will be illustrated with the aide of FIG. 13.

In FIG. 13, an electrodeless discharge lamp 131 is supported on the center of the side resonator group 132 disposed inside high frequency leakage preventing means 136 made of a metal mesh. Numeral 137 denotes a magnetron for driving a high frequency wave and the oscillating antenna 138 of the magnetron 137 is provided inside the coaxial tube peripheral conductor portion 139. The oscillating antenna 138 is electrically isolated from the coaxial tube peripheral conductor portion 139 and connected to the coaxial tube central conductor portion 133. High frequency energy is oscillated from the magnetron 137 by a high voltage power supply and the transmitted high frequency energy is propagated through a coaxial tube and coupled with the side resonator group 132.

As high frequency resonance excitation means, either of electric field coupling type and magnetic field coupling type shown in FIGS. 11 and 12 can be implemented. As the embodiment shown in FIG. 13, radiated light from the electrodeless discharge lamp 131 is reflected from a first reflection mirror 135 provided outside the high frequency leakage preventing means 136, and from a second reflection mirror 134 made of a nonconductive material provided inside the high frequency leakage preventing means 136 and reflected light can be obtained in a desired direction.

The length of the coaxial tube, especially the distance from the oscillating antenna 138 to the side resonator group 132 is so determined as to make the VSWR sufficiently small during the stable lighting time of the electrodeless discharge lamp 131. Furthermore, to improve the impedance matching, matching means 1310 comprising a screw made of metal conductor is desirably provided in the midway of the coaxial tube peripheral conductor portion 139 if necessary. By adjusting the inserted amount of the screw of the matching means 1310 into the coaxial tube peripheral conductor portion 139, a more desirable impedance matching is obtained, thereby enabling the irradiation efficiency of radiated light from the electrodeless discharge lamp 131 to be further increased.

As shown in this embodiment, by arranging the high frequency propagation means as to comprise a coaxial tube alone, downsizing of the whole electrodeless discharge lamp device becomes possible as compared with the arrangement of a high frequency waveguide interposed.

EMBODIMENT 4

In Embodiments 2 and 3, the arrangement with one reflection mirror serving as light reflection means provided respectively inside and outside the high frequency leakage preventing means is shown, but arrangements for light reflection means are not limited to this.

Thus, next, an embodiment with a partial inner wall surface of the high frequency leakage preventing means employed for a light reflecting surface will be described. referring to FIG. 14.

Figure 14:
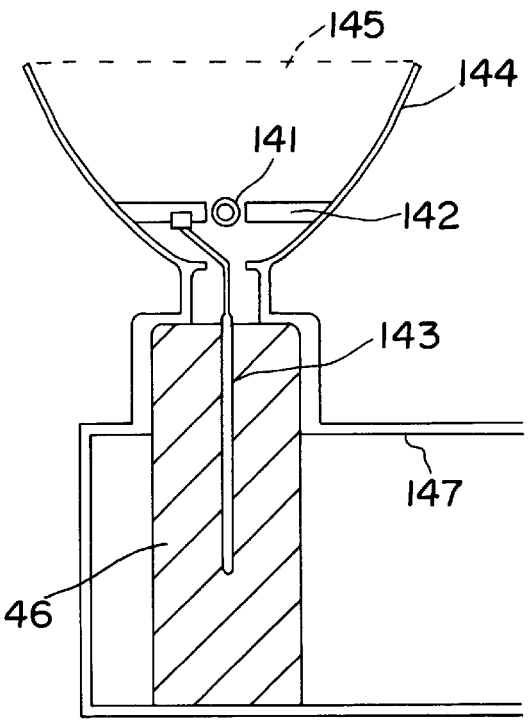
FIG. 14 is a schematic sectional view of a high frequency electrodeless discharge lamp device according to Embodiment 4 of the present invention.

In FIG. 14, the electrodeless discharge lamp 141 is supported by a support bar at the center of the side resonator group 142. Numeral 147 denotes a high frequency waveguide made of a metal conductor. High frequency energy propagated from high frequency oscillation means such as magnetron are coupled with the side resonator group 142 through the coupling antenna 143. Numeral 146 denotes a coupling antenna support section made of a dielectric for fixing the coupling antenna 143 at a proper position. By a high frequency electromagnetic resonance field generated at the center of the side resonator group 142, the electrodeless discharge lamp 141 causes a discharge and emits light. Radiated light by discharge is reflected from the reflected mirror 144 made of a conductor and taken out through a metal mesh 145 to the outside. The reflection mirror 144 and the metal mesh 145 are joined to function as high frequency leakage preventing means.

According to an arrangement as shown in Embodiment 4, part of high frequency leakage preventing means can be employed for light reflection means and the arrangement of an electrodeless discharge lamp device can be more simplified.

EMBODIMENT 5

Next, an embodiment with light reflection means provided only outside the high frequency leakage preventing means will be described referring to FIG. 15.

Figure 15:
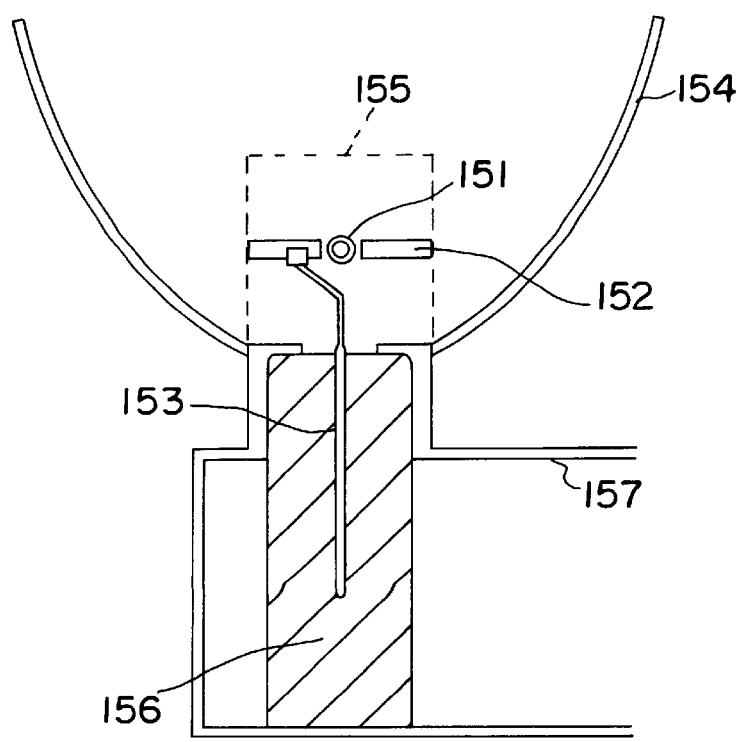
FIG. 15 is a schematic sectional view of a high frequency electrodeless discharge lamp device according to Embodiment 5 of the present invention.

In FIG. 15, the electrodeless discharge lamp 151 is supported at the center of the side resonator group 152. High frequency waves propagated through a high frequency waveguide 157 from high frequency oscillation means such as magnetron are coupled with the side resonator group 152 by means of a coupling antenna 153. Numeral 156 denotes a coupling antenna support section made of a dielectric for fixing the coupling antenna 153 at a proper position. Light radiated by discharge of the electrodeless discharge lamp 151 is reflected from a reflection mirror 154 provided outside the high frequency leakage preventing means 155 mainly comprising a metal mesh and taken out in a desired direction.

When light reflection means is provided inside the high frequency leakage preventing means, a material not of a conductor and having a little dielectric loss has to be selected. However, by arranging light reflection means as to be provided only outside the high frequency leakage preventing means as shown in Embodiment 5, selection of a material composing light reflection means becomes less restrictive.

EMBODIMENT 6

Next, an embodiment with light reflection means provided only inside the high frequency leakage preventing means will be described referring to FIG. 16.

Figure 16:
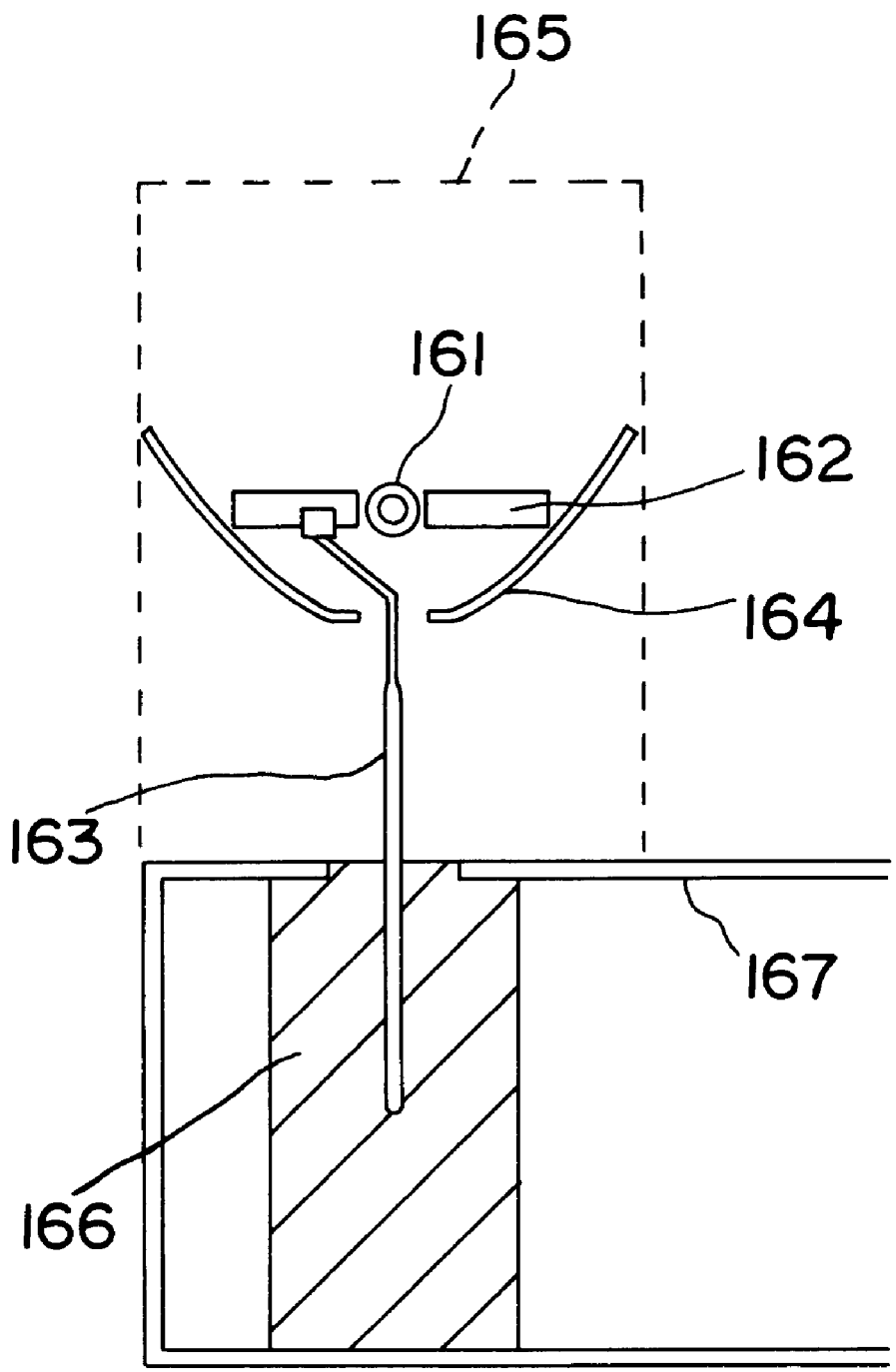
FIG. 16 is a schematic sectional view of a high frequency electrodeless discharge lamp device according to Embodiment 6 of the present invention.

In FIG. 16, the electrodeless discharge lamp 161 is supported at the center of the side resonator group 162. High frequency energy propagated through a high frequency waveguide 167 from high frequency oscillation means such as magnetron are coupled with the side resonator group 162 by means of a coupling antenna 163. Numeral 166 denotes a coupling antenna support section made of a dielectric for fixing the coupling antenna 163 at a proper position. Light radiated by discharge of the electrodeless discharge lamp 161 is reflected from a reflection mirror 164 provided inside the high frequency leakage preventing means 165 mainly comprising a metal mesh and taken out in a desired direction.

By arranging light reflection means as to be provided only inside the high frequency leakage preventing means as shown in Embodiment 6, the portion composing high frequency leakage preventing means and light reflection means can be downsized.

In Embodiments 4 to 6, examples of using a high frequency waveguide as high frequency propagation means were shown as with Embodiment 2, but needless to say, an arrangement as propagates a high frequency wave only by means of a coaxial tube as with Embodiment 3 may be employed.

In Embodiments 2 to 6 that have been described heretofore, a magnetron composing a vacuum tube oscillator is mentioned as an example of high frequency oscillation means, but a recently significantly developed solid oscillation element using a semiconductor amplifier such as GaAs FET may be employed.

Besides, in Embodiments 2 to 6 that have been described heretofore, examples of using a high frequency waveguide and a coaxial line path are shown as high frequency propagation means, but the propagation means are not limited to these examples. For example, strip line path such as microstrip line path or balanced strip line path or other frequency propagation means may be employed.

Furthermore, in Embodiments 2 to 6 that have been described heretofore, an arrangement as effectively orients the radiated light in a desired direction by light reflection means are shown, but needless to say, an arrangement provided with no light reflection means may be employed for some purposes of use.

EMBODIMENT 7

As mentioned in these embodiments, use of a side resonator group enables a high frequency wave to be effectively coupled with a small-sized electrodeless discharge lamp, but a thermal load radically increases with a decrease in the size of a bulb. With a bulb made of quartz glass, it is desired to retain the surface temperature of the bulb below 1000° C., but with increasing input high frequency energy, this retention becomes difficult. Consequently, when quartz glass or the like is selected as a bulb material of an electrodeless discharge lamp, some bulb cooling means for retaining the bulb surface temperature below 1000° C. is desired.

Thus, next, one embodiment of bulb cooling means will be described referring to FIGS. 17 and 18.

In FIG. 17, an electrodeless discharge lamp 171 is discharged to emit light by high frequency energy supplied from a side resonator group 172. The nozzle 173, made of a dielectric material such as quartz glass, blows out sufficient amount of air toward the electrodeless discharge lamp 171 for retaining the bulb surface temperature below 1000° C.

Alternatively, in another aspect of this embodiment, as shown in FIG. 18, a nozzle 183 is provided at each protuberant portion of a side resonator group 182 and sufficient amount of air for retaining the bulb surface temperature below 1000° C. may be so arranged as to be blown out toward the electrodeless discharge lamp 181.

As mentioned above, a high frequency electrodeless discharge lamp device using energy supply means and cooling means according to the embodiment of the present invention can effectively couple high frequency energy to a smaller-size electrodeless discharge lamp than the cavity resonator used in a general high frequency electrodeless discharge and the drive in a larger high frequency energy density becomes possible than that of Embodiment 1 to 6.

Incidentally, in these embodiments, examples of making up an electrodeless discharge lamp of quartz glass were employed for the description, but use of other optically translucent ceramics such as alumina would enable the implementation at an even higher input of high frequency energy.

Besides, in Embodiments 2 to 7, only an aspect of applying high frequency energy supply means using a side resonator group according to the present invention to a high frequency electrodeless discharge lamp was shown, but applications of high frequency discharge supply means according to the present invention are not limited to this. For example, in a device using a high frequency discharge such as plasma CVD, plasma torch or gas laser, high frequency discharge energy supply means according to the present invention is useful in cases where the supply of discharge energy by means of a concentrated high frequency electromagnetic resonance field is necessary for the formation of a relatively small size of plasma. Furthermore, by means of the high frequency energy mentioned above, an object placed at the center of the high frequency energy supply means can be also heated, made to emit light, fused or evaporated.

As mentioned above, the present invention can implement such excellent high frequency energy supply means as enables high frequency discharge concentrated into a smaller space than that of a cavity resonator. And also, use of the high frequency energy supply means enables high frequency energy to be effectively coupled with a small-sized electrodeless discharge lamp and making a light source spotlike enables an excellent high frequency electrodeless discharge lamp device with a more idealized optical design to be implemented.

What is claimed is:

1. High frequency energy supply means comprising a vane type side resonator having a cylinder and a plurality of vanes comprised of conductive material, wherein when high frequency energy is provided from external of said vane type side resonator, thereby resulting in a high frequency electromagnetic resonance field in an interior of said vane type side resonator, and said high frequency energy is supplied to an object disposed in said interior, and wherein said high frequency energy subjects said object to one of discharge, heating, light emission, fusion and evaporation.

2. High frequency energy supply means as set forth in claim 1, wherein N is an integer of 2 or more, and said vane type side resonator has N side resonators, said N side resonators corresponding to said plurality of vanes and a phase difference between electromagnetic fields of adjacent resonators is $2\pi/N$.

3. High frequency energy supply means as set forth in claim 1, wherein the number of vanes is even.

4. High frequency energy supply means as set forth in claim 3, wherein said vane type side resonator has a plurality of side resonators corresponding to said vanes and a phase difference between electromagnetic fields of adjacent resonators is $\pi$.

5. High frequency energy supply means comprising a hole-slot type side resonator comprised of a conductive material having a plurality of holes and slots, wherein when high frequency energy is provided from external of said hole-slot type side resonator, thereby resulting in a high frequency electromagnetic resonance field in an interior of said hole-slot type side resonator, and said high frequency energy is supplied to an object disposed in said interior, and wherein said high frequency energy subjects said object to one of discharge, heating, light emission, fusion and evaporation.

6. High frequency energy supply means as set forth in claim 5, wherein N is an integer of 2 or more, and said hole-slot type side resonator has N side resonators, each side resonator including a hole and a slot and a phase difference between electromagnetic fields of adjacent resonators is $2\pi/N$.

7. High frequency energy supply means as set forth in claim 5, wherein said hole-slot type side resonator has an even number of side resonators, each side resonator including a hole and a slot.

8. High frequency energy supply means as set forth in claim 7, wherein a phase difference between adjacent resonators of said side resonators is $\pi$.

9. High frequency energy supply means including a side resonator group comprising a plurality of side resonators disposed in a substantially ringed shape, and said plurality of side resonators including: (1) an electromagnetically inductive function section comprised of a conductive material for generating an induction current with a change in a magnetic field, said electromagnetically inductive function section substantially ring shaped; and (2) an electrically capacitive function section having a gap provided in part of a route of said induction current, said electrically capacitive function section situated near a center of said ringed shape section, an electrodeless discharge lamp disposed substantially at said center surrounded by said plurality of side resonators, wherein a high frequency electromagnetic resonance field is generated at said center and supplied to said electrodeless discharge lamp, when high frequency energy is provided external of said side resonator group.

10. High frequency energy supply means as set forth in claim 9, wherein said high frequency energy subjects said electrodeless discharge lamp to one of discharge, heating, light emission, fusion and evaporation.

11. A high frequency energy supply means as set forth in claim 9; further including said electrodeless discharge lamp disposed at a center of said high frequency electromagnetic resonance field; high frequency wave leakage preventing means enclosing said high frequency electromagnetic resonance field, a portion of said high frequency wave leakage preventing means being optically transparent; high frequency resonance field excitation means for exciting said high frequency electromagnetic resonance field in said plurality of side resonators; high frequency oscillation means for oscillating a high frequency wave; and high frequency propagation means for propagating the high frequency waves oscillated from said high frequency oscillation means to said high frequency resonance field excitation means to thereby excite said high frequency electromagnetic resonance field.

12. A high frequency energy supply means as set forth in claim 9; further including said electrodeless discharge lamp disposed at a center of said high frequency electromagnetic resonance field;

light reflection means for reflecting light emitted from said electrodeless discharge lamp; high frequency wave leakage preventing means enclosing said high frequency electromagnetic resonance field, a portion of said high frequency wave leakage preventing means being optically transparent;

high frequency resonance field excitation means for exciting said high frequency electromagnetic resonance field in said plurality of side resonators; high frequency oscillation means for oscillating a high frequency wave; and high frequency propagation means for propagating the high frequency waves oscillated from said high frequency oscillation means to said high frequency resonance field excitation means to thereby excite said high frequency electromagnetic resonance field; wherein said light reflection means comprises (1) first light reflection means for reflecting said light passing said high frequency wave leakage preventing means to an exterior of said high frequency wave leakage preventing means; and (2) second light reflection means comprising a nonconductive material and provided inside said high frequency wave leakage preventing means for reflecting said light from an interior to the exterior of said high frequency wave leakage preventing means.

13. A high frequency energy supply means as set forth in claim 9; further including said electrodeless discharge lamp disposed at a center of said high frequency electromagnetic resonance field; light reflection means for reflecting light emitted from said electrodeless discharge lamp; high frequency wave leakage preventing means enclosing said high frequency electromagnetic resonance field, a portion of said high frequency wave leakage preventing means being optically transparent; high frequency resonance field excitation means for exciting said high frequency electromagnetic resonance field in said plurality of side resonators; high frequency oscillation means for oscillating a high frequency wave; and high frequency propagation means for propagating the high frequency waves oscillated from said high frequency oscillation means to said high frequency resonance field excitation means to thereby excite said high frequency electromagnetic resonance field; wherein a part of an inner wall is surface of said high frequency wave leakage preventing means is a light reflection surface, said part of said inner wall surface is a light reflection means for reflecting said light from an interior to an exterior of said high frequency wave leakage preventing means.

14. A high frequency energy supply means as set forth in claim 9; further including said electrodeless discharge lamp disposed at a center of said high frequency electromagnetic resonance field; light reflection means for reflecting light emitted from said electrodeless discharge lamp; high frequency wave leakage preventing means enclosing said high frequency energy supply means, a portion of said high frequency wave leakage preventing means being optically transparent; high frequency resonance field excitation means for exciting said high frequency electromagnetic resonance field in said plurality of side resonators; high frequency oscillation means for oscillating a high frequency wave; and high frequency propagation means for propagating the high frequency waves oscillated from said high frequency oscillation means to said high frequency resonance field excitation means to thereby excite said high frequency electromagnetic resonance field; wherein said light reflection means is provided external to said high frequency wave leakage preventing means to reflect said light passing through said high frequency wave leakage preventing means.

15. A high frequency energy supply means as set forth in claim 9; further including said electrodeless discharge lamp disposed at a center of said high frequency electromagnetic resonance field; light reflection means for reflecting light emitted from said electrodeless discharge lamp; high frequency wave leakage preventing means enclosing said high frequency electromagnetic resonance field, a portion of said high frequency wave leakage preventing means being optically transparent; high frequency resonance field excitation means for exciting said high frequency electromagnetic resonance field in said plurality of side resonators; high frequency oscillation means for oscillating a high frequency wave; and high frequency propagation means for propagating the high frequency waves oscillated from said high frequency oscillation means to said high frequency resonance field excitation means to thereby excite said high frequency electromagnetic resonance field; wherein said light reflection means is provided at an interior of said high frequency wave leakage preventing means to reflect said light passing through said interior of said high frequency wave leakage preventing means to an exterior and is comprised of a nonconductive material.

16. A high frequency energy supply means as set forth in claim 11, further comprising: bulb cooling means for cooling a bulb of said electrodeless discharge lamp.

17. A high frequency energy supply means as set forth in claim 16, wherein said bulb cooling means supplies air or gas to the bulb for cooling of said electrodeless discharge lamp.

18. A high frequency energy supply means as set forth in claim 17, wherein with the aid of a nozzle comprised of a nonconductive material provided near said bulb, said bulb cooling means supplies said air or gas for cooling.

19. A high frequency energy supply means as set forth in claim 17, wherein with the aid of a nozzle perforated in a protuberant portion of said side resonator, said bulb cooling means supplies said air or gas for cooling.

20. A high frequency energy supply means as set forth in claim 11, wherein said high frequency resonance field excitation means is either of electric field coupling type or of magnetic field coupling type.

21. A high frequency energy supply means as set forth in claim 11, wherein a shape of a bulb of said electrodeless discharge lamp is substantially spherical.

22. An electrodeless discharge lamp device comprising:

a plurality of side resonators disposed in a substantially ring shaped configuration defining a gap at a center thereof;

an electrodeless discharge lamp disposed at substantially said center and surrounded by said plurality of said resonators; and a high frequency energy supply for applying a resonant field at said center;

wherein said electrodeless discharge lamp emits a light when said resonant field is applied at said center.

23. An electrodeless discharge lamp of claim 22 wherein said plurality of side resonators further includes a plurality of conductive vanes extending from a conductive cylindrical structure, said plurality of vanes defining said gap at said center.

24. An electrodeless discharge lamp of claim 22 wherein said plurality of side resonators includes a plurality of hole-slot resonators disposed in a cylindrical conductive structure, said plurality of hole-slot resonators disposed substantially circumferentially around said gap at said center.

25. A high frequency energy supply means comprising a vane type side resonator having a cylinder and a plurality of vanes, said cylinder and vanes comprised of a conductive material, wherein a high frequency electromagnetic resonance field is generated in an interior of said vane type side resonator, and supplied to an object disposed in said interior, when energy is provided external of said vane type side resonator, and wherein said object emits a light when said electromagnetic resonance field is generated in the interior of said vane type side resonator.

* * * * *

UNITED STATES PATENT AND TRADEMARK OFFICE
CERTIFICATE OF CORRECTION

PATENT NO.   : 6,049,170
DATED        : April 11, 2000
INVENTOR(S)  : Hochi et al.

It is certified that error appears in the above-identified patent and that said Letters Patent is hereby corrected as shown below:

Title page,
Item [56] References Cited, add the following U.S. Patents:
-- 4,792,732  12/1988  James O'Loughlin
   3,189,901  06/1965  M. Cutolo
   4,695,757  09/1987  Ury et al. --

Title page,
Item [56] References Cited, add the following Foreign Patents:
-- DE4134900  05/1992  Germany
   60-13190   01/1994  European Patent Off.
   035898     09/1981  European Patent Off.
   684629     11/1995  European Patent Off. --

Signed and Sealed this

Fourth Day of September, 2001

*Attest:*

Nicholas P. Godici

*Attesting Officer*

NICHOLAS P. GODICI
*Acting Director of the United States Patent and Trademark Office*